(12) United States Patent
Yoo

(10) Patent No.: US 10,424,366 B2
(45) Date of Patent: Sep. 24, 2019

(54) OPERATIONAL DISTURBANCE MITIGATION BY CONTROLLING WORD LINE DISCHARGE WHEN AN EXTERNAL POWER SUPPLY VOLTAGE IS REDUCED DURING OPERATION OF SEMICONDUCTOR MEMORY DEVICE

(71) Applicant: SK hynix Inc., Icheon-si, Gyeonggi-do (KR)

(72) Inventor: Deung Kak Yoo, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 31 days.

(21) Appl. No.: 15/613,909

(22) Filed: Jun. 5, 2017

(65) Prior Publication Data

US 2018/0068706 A1    Mar. 8, 2018

(30) Foreign Application Priority Data

Sep. 5, 2016  (KR) .......................... 10-2016-0114112

(51) Int. Cl.
| | |
|---|---|
| *G11C 11/26* | (2006.01) |
| *G11C 11/4074* | (2006.01) |
| *G11C 8/08* | (2006.01) |
| *G11C 8/10* | (2006.01) |
| *G11C 8/14* | (2006.01) |
| *G11C 11/408* | (2006.01) |
| *H03K 19/00* | (2006.01) |

(Continued)

(52) U.S. Cl.
CPC ............ *G11C 11/4074* (2013.01); *G11C 8/08* (2013.01); *G11C 8/10* (2013.01); *G11C 8/14* (2013.01); *G11C 11/26* (2013.01); *G11C 11/4085* (2013.01); *G11C 16/0483* (2013.01); *G11C 16/08* (2013.01); *G11C 16/10* (2013.01); *H03K 19/0016* (2013.01)

(58) Field of Classification Search
CPC ......... G11C 7/12; G11C 11/4074; G11C 8/08; G11C 8/10; G11C 8/14; G11C 11/26
See application file for complete search history.

(56) References Cited

U.S. PATENT DOCUMENTS 7,791,948 B2 * 9/2010 Shirota .............. G11C 16/0483
                                                             365/176
9,373,366 B2 * 6/2016 Son .......................... G11C 8/08
(Continued)

FOREIGN PATENT DOCUMENTS

KR    1020140079914 A    6/2014
KR    1020150048427 A    5/2015

*Primary Examiner* — Mushfique Siddique
(74) *Attorney, Agent, or Firm* — William Park & Associates Ltd.

(57) ABSTRACT

A semiconductor memory device includes a memory cell array to which a plurality of word lines are coupled, a voltage generation circuit configured to apply operating voltages to the plurality of word lines during a program operation, and a control logic configured to control the voltage generation circuit to perform a discharge operation for the plurality of word lines when an external power supply voltage is reduced during the program operation, wherein the control logic controls the voltage generation circuit such that, during the discharge operation, a potential level of a selected word line among the plurality of word lines is discharged, and then potential levels of the other unselected word lines are discharged.

9 Claims, 8 Drawing Sheets

(51) Int. Cl.
　　　　*G11C 16/04*　　　(2006.01)
　　　　*G11C 16/08*　　　(2006.01)
　　　　*G11C 16/10*　　　(2006.01)

(56) References Cited

U.S. PATENT DOCUMENTS

| | | | |
|---|---|---|---|
| 9,543,021 B2* | 1/2017 | Kim | G11C 16/10 |
| 9,786,371 B1* | 10/2017 | Lee | G11C 15/046 |
| 2002/0126532 A1* | 9/2002 | Matsunaga | G11C 16/0483 |
| | | | 365/185.17 |
| 2009/0097325 A1* | 4/2009 | Won | G11C 16/3454 |
| | | | 365/185.22 |
| 2011/0267913 A1* | 11/2011 | Chung | G11C 7/12 |
| | | | 365/203 |
| 2012/0170380 A1* | 7/2012 | Kumazaki | G11C 16/0483 |
| | | | 365/185.25 |
| 2013/0051152 A1* | 2/2013 | Lee | G11C 16/0483 |
| | | | 365/185.18 |
| 2013/0107654 A1* | 5/2013 | Kang | G11C 5/145 |
| | | | 365/226 |
| 2014/0160856 A1* | 6/2014 | Joo | G11C 16/10 |
| | | | 365/185.22 |
| 2014/0177332 A1* | 6/2014 | Yoo | G11C 16/0483 |
| | | | 365/185.2 |
| 2017/0154680 A1* | 6/2017 | Lee | G11C 16/10 |
| 2017/0162257 A1* | 6/2017 | Kato | G11C 11/5628 |

* cited by examiner

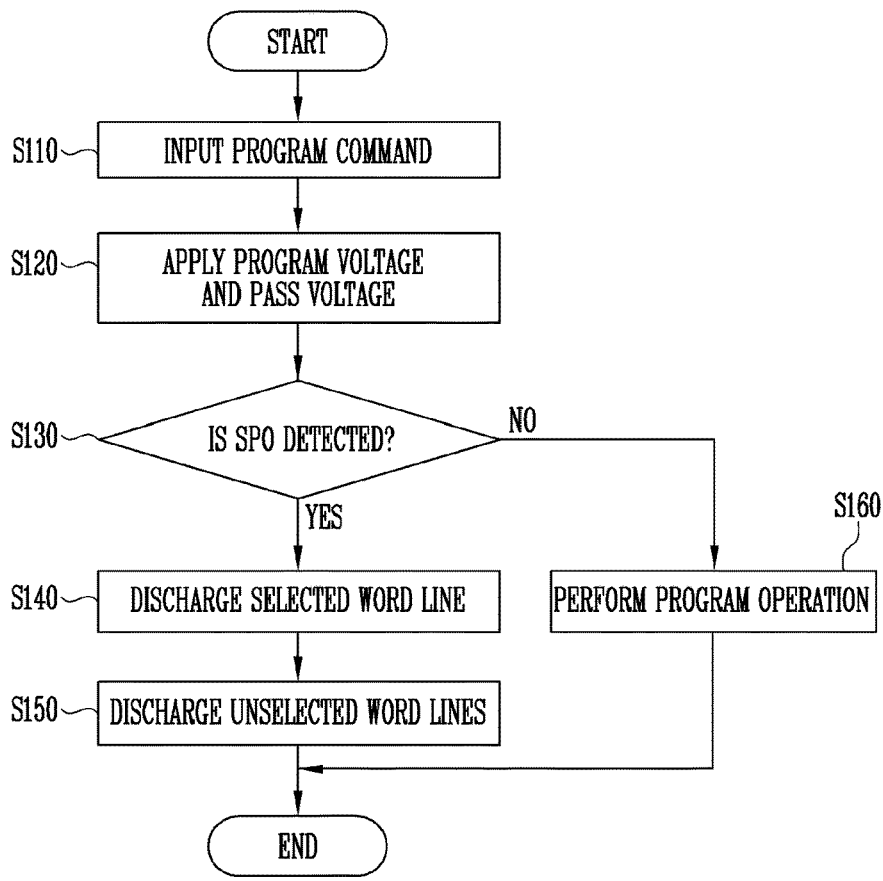
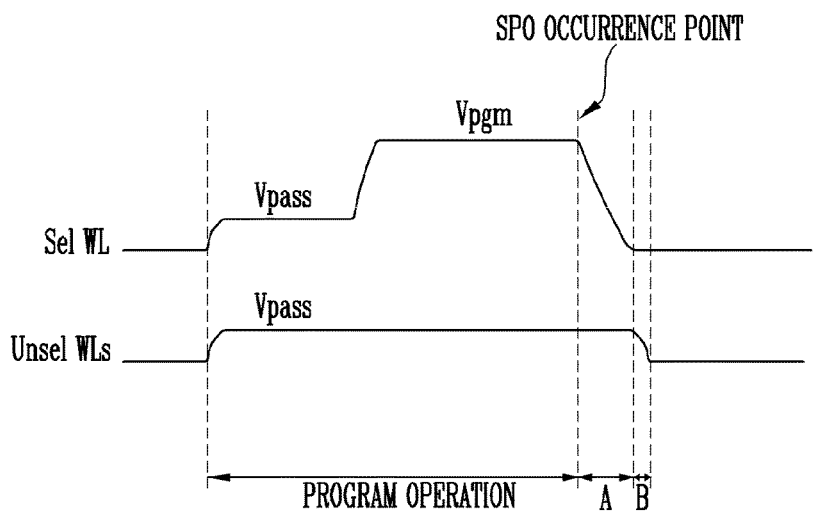

OPERATIONAL DISTURBANCE MITIGATION BY CONTROLLING WORD LINE DISCHARGE WHEN AN EXTERNAL POWER SUPPLY VOLTAGE IS REDUCED DURING OPERATION OF SEMICONDUCTOR MEMORY DEVICE

CROSS-REFERENCE TO RELATED APPLICATION

The present application claims priority under 35 U.S.C. § 119(a) to Korean patent application number 10-2016-0114112 filed on Sep. 5, 2016 in the Korean Intellectual Property Office, the entire disclosure of which is incorporated herein by reference.

BACKGROUND

1. Technical Field

Various embodiments of the present disclosure relate to an electronic device, and more particularly, to a semiconductor memory device and an operating method thereof.

2. Related Art

Semiconductor devices, in particular, semiconductor memory devices are classified into volatile memory devices and nonvolatile memory devices.

The nonvolatile memory devices can maintain data stored therein even when a supply of power is interrupted, although read and write speeds are comparatively low. Therefore, nonvolatile memory devices are used when there is a need for storing data which must be maintained regardless of whether power is supplied. Representative examples of nonvolatile memory devices include read-only memory (ROM), mask ROM (MROM), programmable ROM (PROM), erasable programmable ROM (EPROM), electrically erasable programmable ROM (EEPROM), flash memory, phase-change random access memory (PRAM), magnetic RAM (MRAM), resistive RAM (RRAM), Ferroelectric RAM (FRAM), etc. Flash memory is classified into NOR type memory and NAND type memory.

Flash memory has advantages of both RAM and ROM types. In RAM, data is programmable and erasable. In ROM, data may be store therein and retained even when power is interrupted. Such a flash memory may be widely used as a storage medium of portable electronic devices such as a digital camera, a personal digital assistant (PDA), and an MP3 player.

SUMMARY

Various embodiments of the present disclosure are directed to a semiconductor memory device and operating method thereof in which a disturbance phenomenon may be mitigated by controlling a word line discharge operation when an external power supply voltage is reduced during the overall operation of the semiconductor memory device.

One embodiment of the present disclosure provides a semiconductor memory device including: a memory cell array to which a plurality of word lines are coupled; a voltage generation circuit configured to apply operating voltages to the plurality of word lines during a program operation; and a control logic configured to control the voltage generation circuit to perform a discharge operation for the plurality of word lines when an external power supply voltage is reduced during the program operation, wherein the control logic controls the voltage generation circuit such that, during the discharge operation, a potential level of a selected word line among the plurality of word lines is discharged, and then potential levels of the other unselected word lines are discharged.

Another embodiment of the present disclosure provides a semiconductor memory device including: a memory cell array to which a plurality of word lines are coupled; a voltage generation circuit configured to apply operating voltages to the plurality of word lines during a program operation; and a control logic configured to control the voltage generation circuit to perform a discharge operation for the plurality of word lines when an external power supply voltage is reduced during the program operation, wherein the control logic controls the voltage generation circuit such that, during the discharge operation, a potential level of a selected word line among the plurality of word lines is discharged to a potential level of the other unselected word lines, and then the potential levels of all of the word lines are discharged to a ground level.

Still another embodiment the present disclosure provides an operating method of a semiconductor memory device including: generating a plurality of operating voltages in response to a command inputted from an outside; applying the plurality of operating voltages to a selected word line and unselected word lines of a memory cell array, and performing a program operation; and discharging potential levels of the selected word line and the unselected word lines when an external power supply voltage is reduced during the program operation, wherein a discharge period of the selected word line and a discharge period of the unselected word lines differ from each other.

BRIEF DESCRIPTION OF THE DRAWINGS

Example embodiments will now be described more fully hereinafter with reference to the accompanying drawings; however, the example embodiments may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, the element can be the only element between the two elements, or one or more intervening elements may also be present. Like reference numerals refer to like elements throughout.

FIG. 4 is a flowchart illustrating an operation of a semiconductor memory device according to an embodiment of the present disclosure;

FIG. 5 is a graph showing potentials of word lines to illustrate operation of the semiconductor memory device according to an embodiment of the present disclosure;

DETAILED DESCRIPTION

Figure 1:
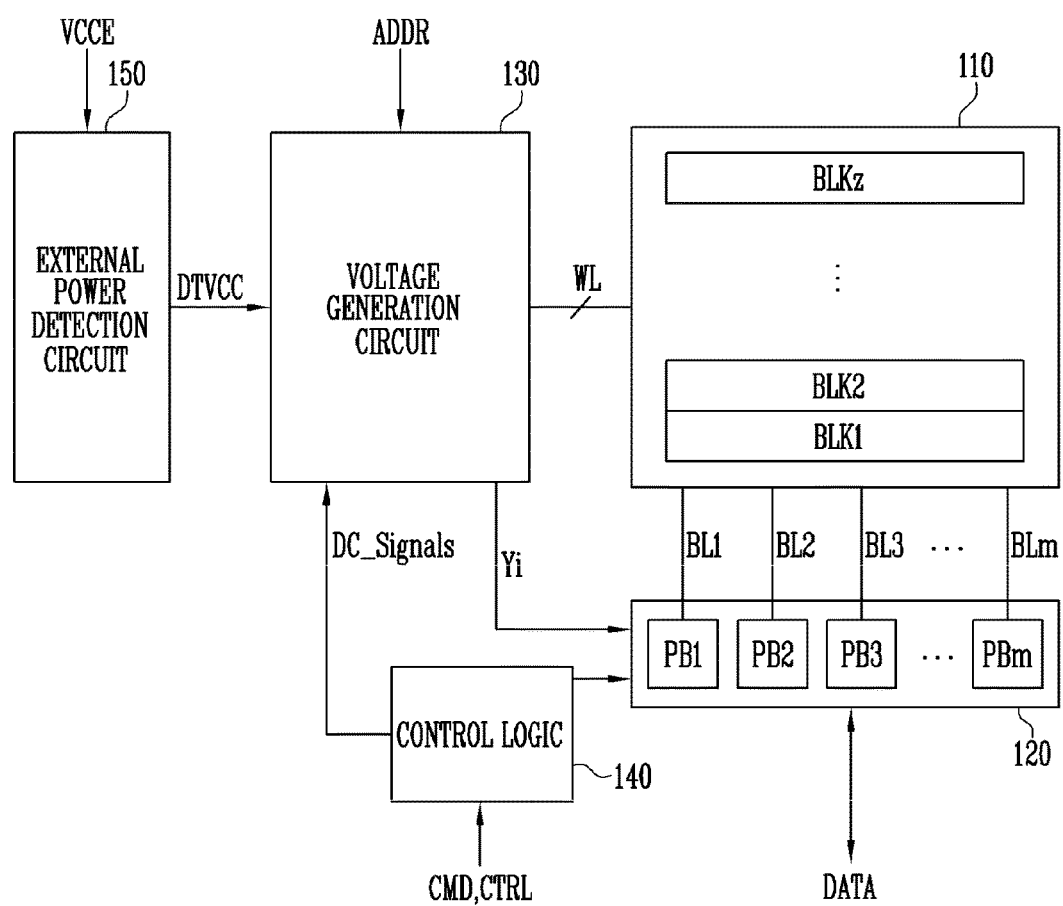
FIG. 1 is a block diagram illustrating a semiconductor memory device according to an embodiment of the present disclosure.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but the terms should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a block diagram illustrating a semiconductor memory device according to an embodiment of the present disclosure.

Referring to FIG. 1, a semiconductor memory device 100 may include a memory cell array 110, a read/write circuit 120, a voltage generation unit 130, a control logic 140, and an external power detection circuit 150.

The memory cell array 110 includes a plurality of memory blocks BLK1 to BLKz. The memory blocks BLK1 to BLKz are coupled to the voltage generation circuit 130 through word lines WL. The memory blocks BLK1 to BLKz are also coupled to the read/write circuit 120 through bit lines BL1 to BLm. Each of the memory blocks BLK1 to BLKz includes a plurality of memory cells. In an embodiment, the plurality of memory cells may be nonvolatile memory cells. A plurality of memory cells which are coupled to each word line may be defined as one page. In other words, the memory cell array 110 is formed of a plurality of pages.

In addition, each of the memory blocks BLK1 to BLKz of the memory cell array 110 includes a plurality of cell strings. The plurality of cell strings included in the memory cell array 110 are arranged to have a different distances from the voltage generation circuit 130 depending on the position at which the plurality of cell strings are disposed, whereby the word lines WL that couple the voltage generation circuit 130 to the cell strings may have different lengths. That is, in the case of a cell string adjacent to the voltage generation circuit 130, the length of the word lines WL are shorter than those of a cell string disposed further away from the voltage generation circuit 130. Therefore, each of the cell strings may have a different word line resistance value. Thereby, when a sudden power off problem occurs in which the external power supply voltage rapidly decreases and an operation of discharging global word lines and word lines is thus performed, the time it takes to discharge the word lines for each string varies. Consequently, a channel boosting level of each string may vary.

Each cell string includes a drain select transistor, a plurality of memory cells, and a source select transistor which are coupled in series between a bit line and a source line. The memory cell array 110 will be described in detail later herein.

The read/write circuit 120 and the voltage generation circuit 130 may be defined as a peripheral circuit that performs the overall operation for the memory cell array 110.

The read/write circuit 120 includes a plurality of page buffers PB1 to PBm. The plurality of page buffers PB1 to PBm are coupled to the memory cell array 110 through the bit lines BL1 to BLm. Each of the page buffers PB1 to PBm controls the potential of a corresponding one of the bit lines BL1 to BLm according to data DATA to be programmed during a program voltage application operation of the program operation. In more detail, when data DATA to be programmed is first data (for example, '0'), each of the page buffers PB1 to PBm applies a program enable voltage to a corresponding one of the bit lines (any one of BL1 to BLm). When data DATA to be programmed is second data (for example, '1'), each of the page buffers PB1 to PBm applies a program inhibit voltage to a corresponding one of the bit lines (any one of BL1 to BLm).

The read/write circuit 120 may operate in response to control of the control logic 140.

In an embodiment, the read/write circuit 120 may include page buffers (or page resistors), a row select circuit, etc.

The voltage generation circuit 130 may generate a plurality of operating voltages according to control of the control logic 140. For example, during a program operation, the voltage generation circuit 130 generates a program voltage Vpgm and a pass voltage Vpass under control of the control logic 140 and outputs the program voltage Vpgm and the pass voltage Vpass to the word lines WL of the memory cell array 110.

When a sudden power off problem occurs in which the external power supply voltage suddenly decreases, the voltage generation circuit 130 discharges potential levels of the word lines WL in response to a detection signal DTVCC and discharges signals DC_Signals that are outputted from the control logic 140.

The control logic 140 is coupled to the read/write circuit 120 and the voltage generation circuit 130. The control logic 140 receives a command CMD and a control signal CTRL through an input/output buffer (not shown) of the semiconductor memory device 100. The control logic 140 is configured to control the overall operation of the semiconductor memory device 100 including a program operation, a read operation, and an erase operation in response to the command CMD and the control signal CTRL. When a sudden power off problem occurs in which the external power supply voltage suddenly decreases during performance of the overall operation of the semiconductor memory device, the control logic 140 outputs discharge signals DC_Signals and controls the voltage generation circuit 130 such that the voltage generation circuit 130 discharges potential levels of the global word lines and the word lines.

The control logic 140 may control the voltage generation circuit 130 such that, after potential levels of selected word lines among the word lines are discharged, potential levels of the other unselected word lines are discharged.

In another embodiment, the control logic 140 may control the voltage generation circuit 130 such that, after the potential levels of the selected word lines among the word lines are discharged to the potential levels of the other unselected word lines, all of the word lines are simultaneously discharged.

When an external power supply voltage VCCE is reduced to a predetermined level such as a reference voltage or less, the external power detection circuit 150 detects the external power supply voltage VCCE and outputs a detection signal DTVCC to the voltage generation circuit 130.

Figure 2:
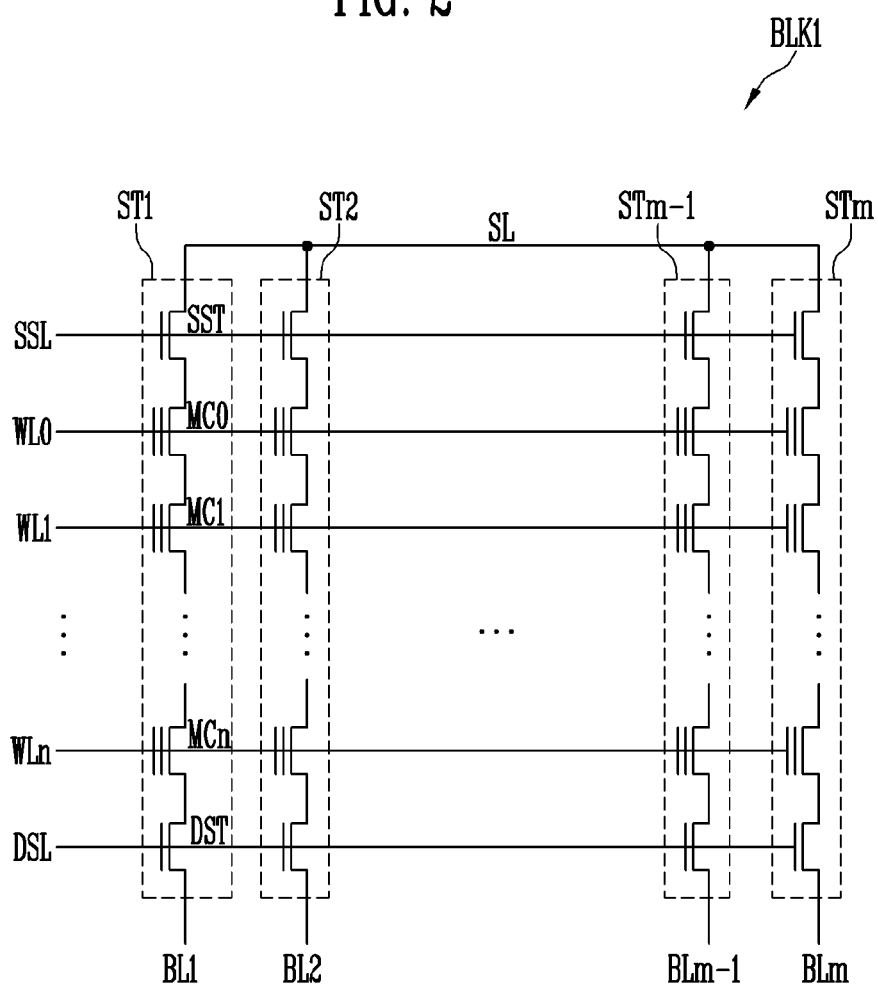
FIG. 2 is a circuit diagram illustrating a memory block of FIG. 1.

FIG. 2 is a circuit diagram illustrating one memory block BLK1 of the memory blocks shown in FIG. 1.

Referring to FIG. 2, the memory block BLk1 includes a plurality of cell strings ST1 to STm. The cell strings ST1 to STm are respectively coupled to the bit lines BL1 to BLm.

Each of the cell strings ST1 to STm includes a source select transistor SST, a plurality of memory cells MC0 to MCn that are coupled in series, and a drain select transistor DST. The source select transistor SST is coupled to a source select line SSL. The memory cells MC0 to MCn are respectively coupled to word lines WL0 to WLn. The drain select transistor DST is coupled to a drain select line DSL. A source line SL is coupled to a source side of the source select transistor SST. Each of the bit lines BL1 to BLm is coupled to a drain side of the corresponding drain select transistor DST. The plurality of word lines WL described with reference to FIG. 1 include the source select line SSL, the word lines WL0 to WLn and the drain select line DSL. The source select line SSL, the word lines WL0 to WLn, and the drain select line DSL are operated by the voltage generation circuit 130. Although not shown, the voltage generation circuit 130 may be disposed on one side of the memory cell array 110 and, for example, disposed at a position adjacent to a cell string ST1. Therefore, because the cell string ST1 is disposed adjacent to the voltage generation circuit 130, the coupling distance between the word lines WL0 to WLn and the cell string ST1 is short. In the case of cell strings ST2 to STm that are disposed further away from where the voltage generation circuit 130 is disposed, the coupling distance of the word lines WL0 to WLn is gradually increased from the cell string ST2 to the cell string STm.

Figure 3:
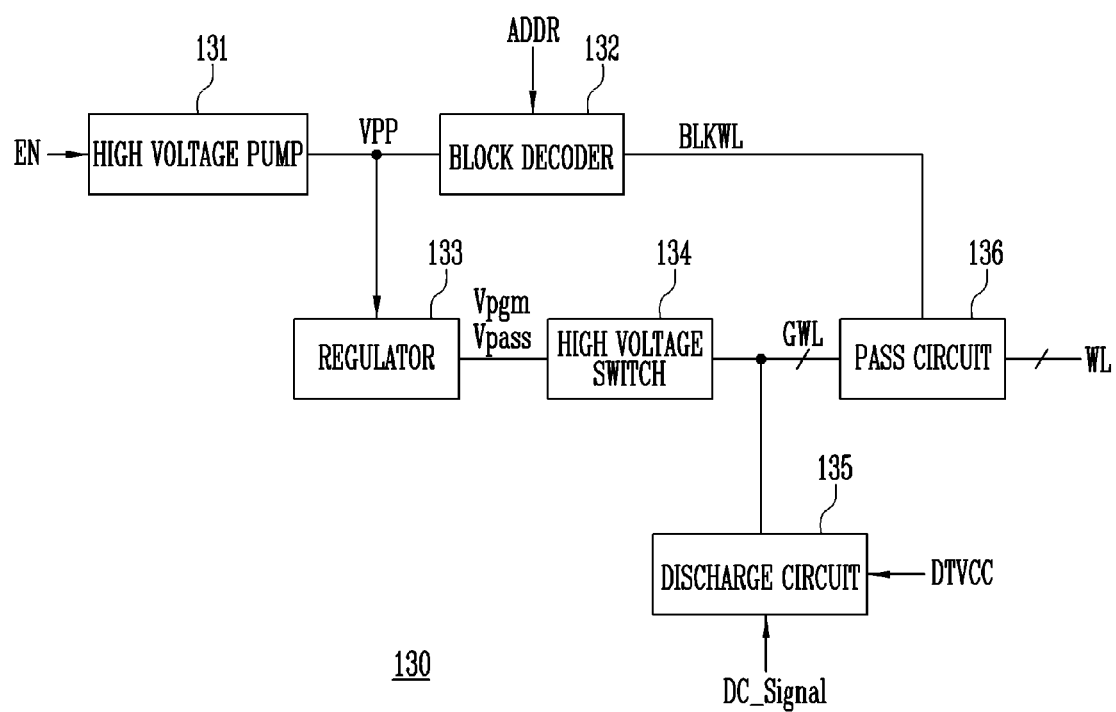
FIG. 3 is a block diagram illustrating in detail a configuration of a voltage generation circuit of FIG. 1.

FIG. 3 is a detailed block diagram of the voltage generation circuit of FIG. 1.

Referring to FIG. 3, the voltage generation circuit 130 includes a high voltage pump 131, a block decoder 132, a regulator 133, a high voltage switch 134, a discharge circuit 135, and a pass circuit 136.

The high voltage pump 131 is activated in response to an enable signal EN that is outputted from the control logic, and performs a pumping operation to generate and output a high voltage VPP.

The block decoder 132 receives the high voltage VPP that is outputted from the high voltage pump 131, and outputs a block select signal BLKWL corresponding to at least one of the memory blocks included in the memory cell array, in response to an address signal ADDR. In an embodiment, the block select signal BLKWL has a potential level of high voltage VPP.

The regulator 133 receives the high voltage VPP that is outputted from the high voltage pump 131 and regulates the high voltage VPP, thereby generating a plurality of operating voltages, for example, a program voltage Vpgm and a pass voltage Vpass.

The high voltage switch 134 applies the plurality of operating voltages Vpgm and Vpass to global word lines GWL coupled to the pass circuit 136.

The discharge circuit 135 is coupled to the global word lines GWL, and discharges the potential levels of the global word lines GWL in response to both a detection signal DTVCC that is generated when the external power supply voltage is lower than a reference voltage and to discharge signals DC_Signals that are outputted from the control logic. Here, since the global word lines GWL are electrically coupled to the word lines WL of the memory cell array through the pass circuit 136, the potential levels of the word lines WL are also discharged when the potential levels of the global word lines GWL are discharged.

Furthermore, during an operation of discharging the global word lines GWL and the word lines WL, the discharge circuit 135 may discharge the potential level of a selected word line among the plurality of word lines WL in response to the discharge signals DC_Signals, before discharging the potential levels of the other unselected word lines. For example, during a program operation, the potential level of the selected word line to which a program voltage Vpgm is applied may be discharged before the potential levels of the other unselected word lines to which a pass voltage Vpass is applied are discharged.

In another embodiment, during the operation of discharging the global word lines GWL and the word lines WL the control logic 140 controls the voltage generation circuit 130 such that, the discharge circuit 135 may discharge, in response to the discharge signal DC_Signals, the potential level of a word line among the plurality of the word lines WL to the potential level of the other unselected word lines, and then simultaneously discharge the potential levels of all of the word lines to the ground voltage level. In other words, in response to a detection signal DTVCC and the discharge signals DC_Signals, the discharge circuit 135 may discharge the potential level of the selected word line WL to which a program voltage Vpgm among the operating voltages Vpgm is applied, to the potential level of the unselected word lines to which a pass voltage Vpass is applied. The discharge circuit may 135 then simultaneously discharge the potential levels of the selected word line WL and the unselected word lines to the ground voltage level.

The pass circuit 136 couples the global word lines GWL to the word lines WL in response to a block select signal BLKWL outputted from the block decoder 132.

FIG. 4 is a flowchart illustrating an operation of a semiconductor memory device according to an embodiment of the present disclosure.

FIG. 5 is a graph showing the potentials of word lines illustrating the operation of a semiconductor memory device according to the embodiment of the present disclosure.

The operation of the semiconductor memory device according to an embodiment of the present disclosure will be described with reference to FIGS. 1 to 5.

Although an embodiment of the present disclosure illustrates a program operation among the overall operations of the semiconductor memory device as one example, the present disclosure is not limited to this operation and may be applied to all of the overall operations of the semiconductor memory device including a read operation and an erase operation.

When a command CMD and a control signal CTRL for a program command is inputted from outside the semiconductor memory device (at S110), the control logic 140 controls the read/write circuit 120 and the voltage generation circuit 130 to perform a program operation of the semiconductor memory device.

After the read/write circuit 120 temporarily stores data DATA to be programmed, inputted from the outside, the read/write circuit 120 controls the potential levels of the bit lines BL1 to BLm to a program enable voltage or a program inhibit voltage in accordance with the temporarily stored data DATA.

Furthermore, the voltage generation circuit 130 generates a program voltage Vpgm and a pass voltage Vpass under control of the control logic 140, and applies the program voltage Vpgm and the pass voltage Vpass to the word lines WL of a selected memory block among the memory blocks BLK1 to BLKz that are included in the memory cell array 110 (at S120).

In more detail, the high voltage pump 131 of the voltage generation circuit 130 is activated in response to an enable signal EN outputted from the control logic 140, and performs a pumping operation to generate and output a high voltage VPP. The block decoder 132 receives the high voltage VPP that is outputted from the high voltage pump 131, and outputs a block select signal BLKWL corresponding to at least one of the memory blocks BLK1 to BLKz included in the memory cell array, in response to the block decoder 132 receiving an address signal ADDR.

The regulator 133 receives the high voltage VPP that is outputted from the high voltage pump 131 and generates, using the high voltage VPP, a plurality of operating voltages, for example, a program voltage Vpgm and a pass voltage Vpass. The high voltage switch 134 transmits the plurality of operating voltages Vpgm and Vpass that are generated by the regulator 133, to the global word lines GWL coupled to the pass circuit 136. The pass circuit 136 couples the global word lines GWL to the word lines WL in response to a block select signal BLKWL outputted from the block decoder 132 so that the plurality of operating voltages Vpgm and Vpass are applied to the word lines WL. In this regard, during a program operation the program voltage Vpgm is applied to the selected word line Sel WL among the word lines WL and the pass voltage Vpass is applied to the other unselected word lines Unsel WL. In addition, after a pass voltage Vpass is applied to the selected word line Sel WL for a predetermined time, the program voltage Vpgm may be applied to the selected word line Sel WL. That is, after the pass voltage Vpass is applied to all of the word lines WL, the program voltage Vpgm may be applied to the selected word line Sel WL and the pass voltage Vpass may be continuously applied to the unselected word lines Unsel WL. In this way, the program operation may be performed.

During the above-described program operation, a sudden power off (SPO) problem in which the external power voltage VCCE suddenly decreases may be occur. The external power detection circuit 150 detects occurrence of an SPO (at S130), and then generates and outputs a detection signal DTVCC. If there is no sudden power off problem of the external power supply voltage, the semiconductor memory device continuously executes the program operation that is being performed (at S160).

When the external power supply voltage VCCE is reduced during the program operation the detection signal DTVCC is generated and outputted from the external power detection circuit 150, and the control logic 140 controls the voltage generation circuit 130 to perform an operation of discharging the global word lines GWL and the word lines WL.

The high voltage pump 131 of the voltage generation circuit 130 is inactivated in response to an enable signal EN that is inactivated, and thus interrupts an operation of generating the high voltage VPP. Therefore, the output of the program voltage Vpgm and the pass voltage Vpass that are generated from the regulator 133 is interrupted.

The discharge circuit 135 of the voltage generation circuit 130 discharges the potential levels of the selected word line Sel WL and one of the global word lines GWL to which the program voltage Vpgm has been being applied, to the ground voltage level during a first discharge period A in response to the detection signal DTVCC and the discharge signals DC_Signals (at S140).

Thereafter, the discharge circuit 135 of the voltage generation circuit 130 discharges the potential levels of the unselected word lines Unsel WL and the remaining ones of the global word lines GWL to which the pass voltage Vpass has been being applied, to the ground voltage level during a second discharge period B in response to the detection signal DTVCC and the discharge signal DC_Signals (at S150). The first discharge period A may be differ from the second discharge period B.

As described above, according to an embodiment of the present disclosure, when the SPO problem occurs during the overall operation of the semiconductor memory device, the potential level of the selected word line is discharged and, thereafter, the potential levels of the other unselected word lines are discharged. Consequently, although the resistance values of word lines of the cell strings included in the memory block differ from each other, the potential level of the selected word line having a comparatively high potential level is first discharged, whereby a difference in a channel boosting level between the cell strings may be reduced. The potential level of the selected word line higher than the potential levels of the unselected word line is first discharged, and then the potential levels of the unselected word line are discharged, so that channel boosting levels of the memory strings may be controlled depending on the potential levels of the unselected word lines.

Figure 6:
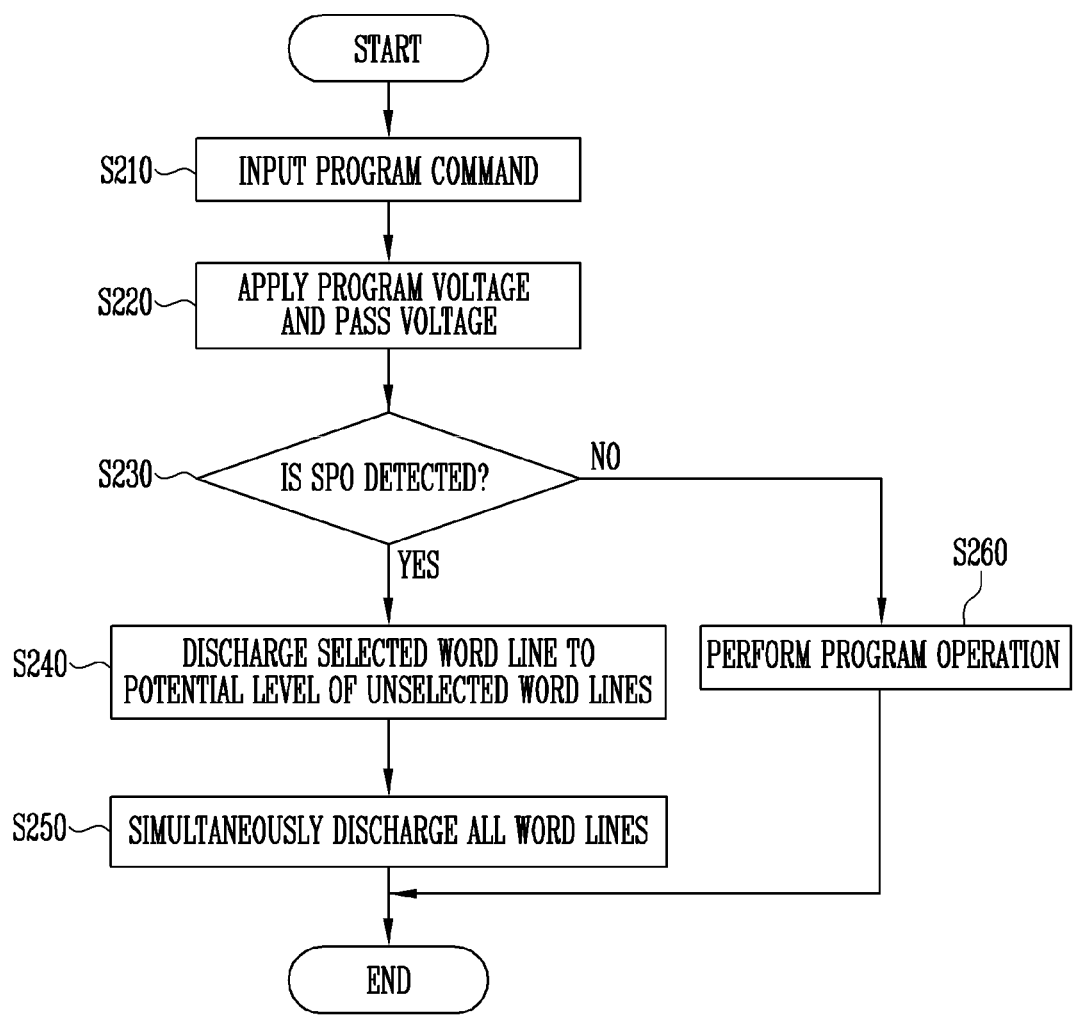
FIG. 6 is a flowchart illustrating operation of a semiconductor memory device according to another embodiment of the present disclosure.

FIG. 6 is a flowchart illustrating an operation of the semiconductor memory device according to an embodiment of the present disclosure.

Figure 7:
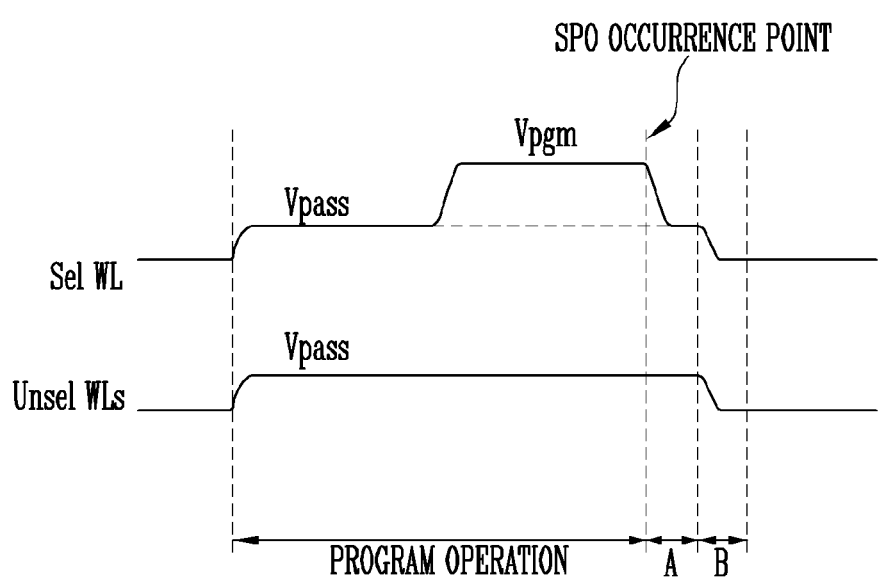
FIG. 7 is a graph showing potentials of word lines to illustrate operation of the semiconductor memory device according to an embodiment of the present disclosure.

FIG. 7 is a graph showing the potentials of word lines illustrating an operation of the semiconductor memory device according to an embodiment of the present disclosure.

The operation of the semiconductor memory device according to this embodiment of the present disclosure will be described with reference to FIGS. 1 to 3, 6 and 7.

Although the embodiment of the present disclosure illustrates a program operation among the overall operations of the semiconductor memory device as one example, the present disclosure is not limited to this operation and may be applied to the overall operations of the semiconductor memory device including a read operation and an erase operation.

When a command CMD and a control signal CTRL for a program command is inputted from outside the semiconductor memory device (at S210), the control logic 140 controls the read/write circuit 120 and the voltage generation circuit 130 to perform a program operation of the semiconductor memory device.

After the read/write circuit 120 temporarily stores data DATA to be programmed, inputted from the outside, the read/write circuit 120 controls the potential levels of the bit lines BL1 to BLm to a program enable voltage or a program inhibit voltage according to the temporarily stored data DATA.

Furthermore, the voltage generation circuit 130 generates a program voltage Vpgm and a pass voltage Vpass under control of the control logic 140, and applies the program voltage Vpgm and the pass voltage Vpass to the word lines WL of a selected memory block among the memory blocks BLK1 to BLKz that are included in the memory cell array 110 (at S220).

In more detail, the high voltage pump 131 of the voltage generation circuit 130 is activated in response to an enable signal EN outputted from the control logic 140, and performs a pumping operation to generate and output a high voltage VPP. The block decoder 132 receives a high voltage VPP that is outputted from the high voltage pump 131, and outputs a block select signal BLKWL corresponding to at least one memory block of the memory blocks BLK1 to BLKz included in the memory cell array, in response to the block decoder 132 receiving an address signal ADDR.

The regulator 133 receives the high voltage VPP that is outputted from the high voltage pump 131 and generates, using the high voltage VPP, a plurality of operating voltages, for example, a program voltage Vpgm, and a pass voltage Vpass. The high voltage switch 134 transmits the plurality of operating voltages Vpgm and Vpass that are generated by the regulator 133, to the global word lines GWL coupled to the pass circuit 136. The pass circuit 136 couples the global word lines GWL to the word lines WL in response to a block select signal BLKWL outputted from the block decoder 132 so that the plurality of operating voltages Vpgm and Vpass are applied to the word lines WL. In this regard, during a program operation the program voltage Vpgm is applied to the selected word line Sel WL among the word lines WL and the pass voltage Vpass is applied to the other unselected word lines Unsel WL. In addition, after a pass voltage Vpass is applied to the selected word line Sel WL for a predetermined time, the program voltage Vpgm may be applied to the selected word line Sel WL. That is, after the pass voltage Vpass is applied to all of the word lines WL, the program voltage Vpgm may be applied to the selected word line Sel WL and the pass voltage Vpass may be continuously applied to the unselected word lines Unsel WL. In this way, the program operation may be performed.

During the above-described program operation, an SPO problem in which the external power supply voltage VCCE suddenly decreases may occur. The external power detection circuit 150 detects occurrence of an SPO (at S230), and then generates and outputs a detection signal DTVCC. If there is no SPO problem of the external power supply voltage, the semiconductor memory device continuously executes the program operation that is being performed (at S260).

When the external power supply voltage VCEE is reduced during the program operation the detection signal DTVCC is generated and outputted from the external power detection circuit 150, and the control logic 140 controls the voltage generation circuit 130 to perform an operation of discharging the global word lines GWL and the word lines WL.

The high voltage pump 131 of the voltage generation circuit 130 is inactivated in response to an enable signal EN that is inactivated, and thus interrupts an operation for generating the high voltage VPP. Therefore, the output of the program voltage Vpgm and the pass voltage Vpass that are generated from the regulator 133 is interrupted.

In response to the detection signal DTVCC and the discharge signal DC_Signals, the discharge circuit 135 of the voltage generation circuit 130 discharges, during a first discharge period A, the potential levels of the selected word line Sel WL and one of the global word lines to which the program voltage Vpgm has been being applied, to the potential levels of the unselected word lines Unsel WL and the global word lines to which the pass voltage Vpass has been being applied (at S240).

Thereafter, the discharge circuit 135 of the voltage generation circuit 130 discharges the potential levels of all of the global word lines GWL and all of the word lines Sel WL and Unsel WL, to the ground voltage level during a second discharge period B in response to the detection signal DTVCC and the discharge signal DC_Signals (at S250). The first discharge period A may differ from the second discharge period B.

As described above, according to an embodiment of the present disclosure, if the SPO problem in which the external power voltage VCCE suddenly decreases is caused during the overall operation of the semiconductor memory device, the potential level of the selected word line is discharged to the potential level of the unselected word lines and, thereafter, the potential levels of all of the word lines are simultaneously discharged to the ground level. As such, in an embodiment, the potential level of the selected word line having a comparatively high potential level is discharged to the potential level of the other word lines to reduce a difference in the channel boosting level between cell strings and, thereafter, the potential levels of all of the word lines are discharged. As a result, although the resistance values of the word lines of the cell strings included in the memory block differ from each other, the disturbance phenomenon of the semiconductor memory device may be mitigated.

Figure 8:
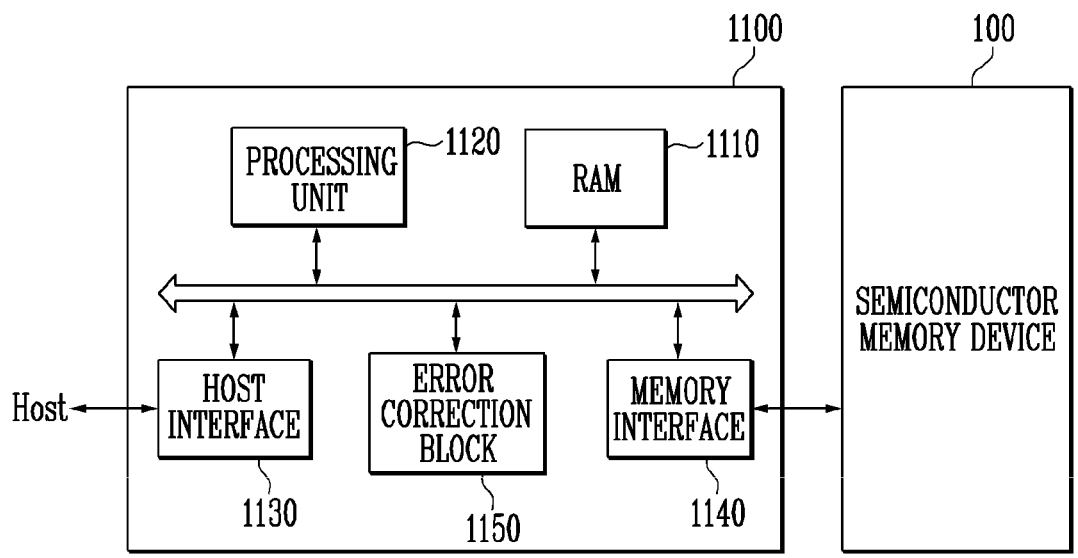
FIG. 8 is a block diagram showing a memory system including the semiconductor memory device of FIG. 1.

FIG. 8 is a block diagram showing a memory system including the semiconductor memory device of FIG. 1.

Referring to FIG. 8, the memory system 1000 includes a semiconductor memory device 100 and a controller 1100.

The semiconductor memory device 100 may have the same configuration and operation as the semiconductor memory device described with reference to FIG. 1. Hereinafter, repetitive explanations will be omitted.

The controller 1100 is coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the host Host and the semiconductor memory device 100. The controller 1100 is configured to drive firmware for controlling the semiconductor memory device 100.

The controller 1100 includes a RAM (Random Access Memory) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls the overall operation of the controller 1100. In addition, the controller 1100 may temporarily store program data provided from the host Host during the write operation.

The host interface 1130 includes a protocol for performing data exchange between the host Host and the controller 1100. In an exemplary embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or NOR interface.

The error correction block 1150 uses an error correcting code (ECC) to detect and correct errors in data received from the semiconductor memory device 100. The processing unit 1120 may adjust the read voltage according to an error detection result from the error correction block 1150, and control the semiconductor memory device 100 to perform re-reading. In an exemplary embodiment, the error correction block may be provided as an element of the controller 1100.

The controller 1100 and the semiconductor memory device 100 may be integrated into a single semiconductor device. In an exemplary embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host Host coupled to the memory system 2000 may be phenomenally improved.

In another embodiment, the memory system 1000 may be provided as one of various elements of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 100 or the memory system 1000 may be embedded in various types of packages. For example, the semiconductor memory device 100 or the memory system 2000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 9:
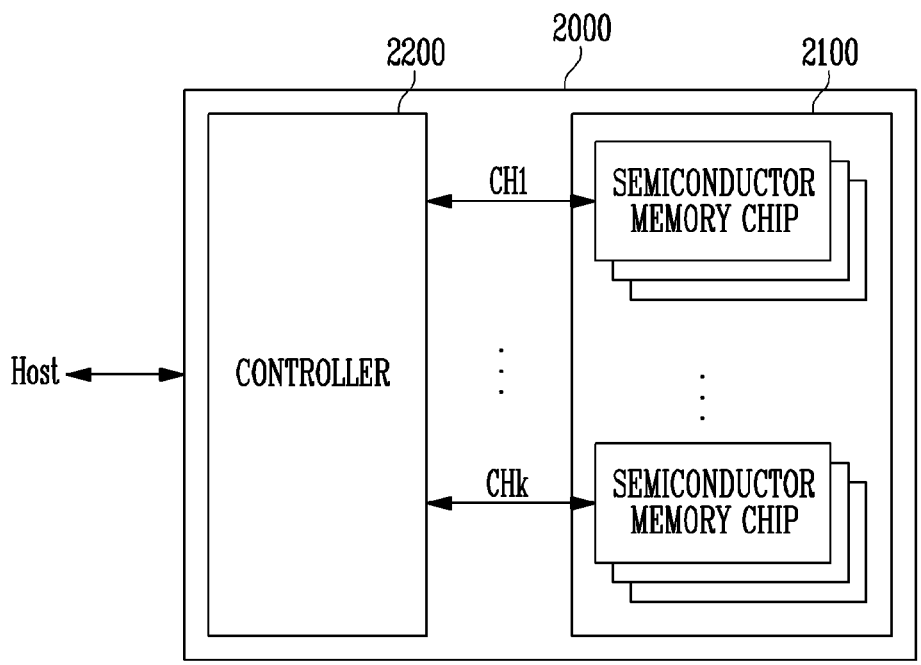
FIG. 9 is a block diagram showing an application example of the memory system of FIG. 8.

FIG. 9 is a block diagram showing an application example of the memory system of FIG. 8.

Referring to FIG. 9, the memory system 2000 includes a semiconductor memory device 2100 and a controller 2200. The semiconductor memory device 2100 includes a plurality of memory chips. The semiconductor memory chips are divided into a plurality of groups.

In FIG. 9, it is illustrated that each of the plurality of groups of chips communicates with the controller 2200 through first to $k_{th}$ channels CH1 to CHk. Each semiconductor memory chip may have the same configuration and operation as those of an embodiment of the semiconductor memory device 100 described with reference to FIG. 1.

Each group of chips communicates with the controller 2200 through one common channel. The controller 2200 has the same configuration as that of the controller 1100 described with reference to FIG. 8 and is configured to control a plurality of memory chips of the semiconductor memory device 2100 through the plurality of channels CH1 to CHk.

Figure 10:
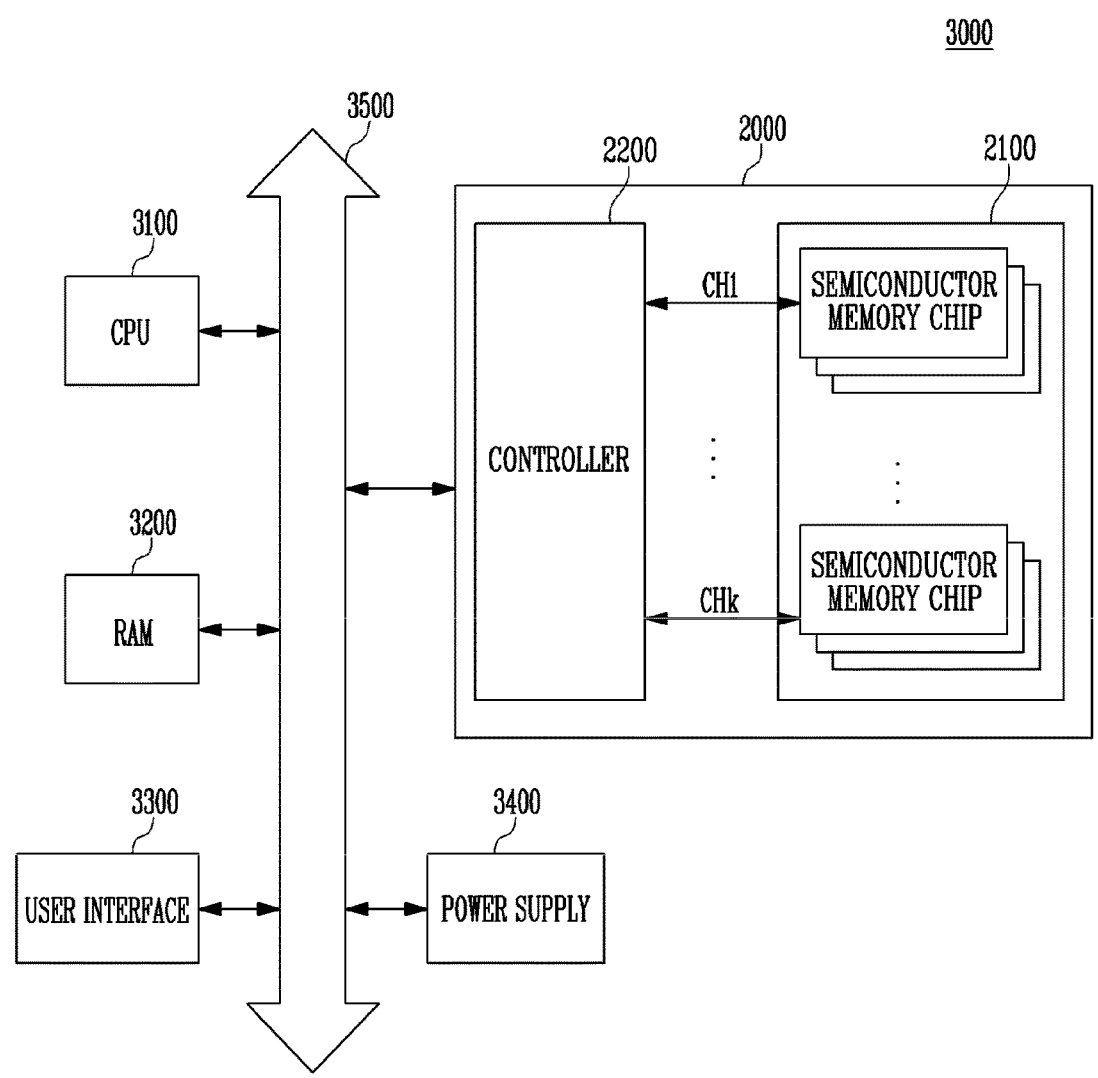
FIG. 10 is a block diagram showing a computing system including the memory system illustrated with reference to FIG. 9.

FIG. 10 is a block diagram showing a computing system including the memory system illustrated with reference to FIG. 9. Referring to FIG. 10, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 10, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 10, the memory system 2000 described with reference to FIG. 9 is illustrated as being used. However, the memory system 2000 may be replaced with the memory system 1000 described with reference to FIG. 8. In an embodiment, the computing system 3000 may include all of the memory systems 1000 and 2000 described with reference to FIGS. 8 and 9.

According to the present disclosure, although a word line discharge operation is performed by a reduction in external power supply voltage during the overall operation of the semiconductor memory device, a disturbance phenomenon of the semiconductor memory device may be reduced, whereby the threshold voltage distribution of memory cells may be improved.

Example embodiments have been disclosed herein, and although specific terms are employed, they are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device comprising:
   a memory cell array to which a plurality of word lines are coupled;
   a voltage generation circuit configured to apply operating voltages to the plurality of word lines during a program operation; and
   a control logic configured to control the voltage generation circuit to perform a discharge operation for the plurality of word lines when an external power supply voltage is reduced during the program operation,
   wherein the control logic controls the voltage generation circuit such that, during the discharge operation,
   a potential level of a selected word line is discharged to potential levels of unselected word lines in a state in which the potential levels of the unselected word lines are maintained, and after the potential level of the selected word line is discharged to the potential levels of the unselected word lines, the potential level of the selected word line and the potential levels of the unselected word lines are simultaneously discharged to a ground level.

2. The semiconductor memory device according to claim 1, wherein the voltage generation circuit applies a program voltage to the selected word line and applies a pass voltage to the unselected word lines, during the program operation.

3. The semiconductor memory device according to claim 1, wherein the voltage generation circuit comprises:
   a high voltage pump configured to generate a high voltage in response to an enable signal;
   a regulator configured to regulate the high voltage and generate the operating voltages, wherein the operating voltages are applied to global word lines;
   a block decoder configured to generate a block select signal in response to an address signal;
   a pass circuit configured to couple the global word lines to the plurality of word lines in response to the block select signal; and
   a discharge circuit coupled to the global word lines and configured to discharge, in response to a detection signal and discharge signals, potential levels of the plurality of word lines that are electrically coupled through the pass circuit.

4. The semiconductor memory device according to claim 3, further comprising:
   an external power detection circuit configured to generate and output the detection signal when the external power supply voltage is lower than a reference voltage.

5. The semiconductor memory device according to claim 4, wherein the detection signal is output to the voltage generation circuit which discharges the potential level of the global word lines in response to the detection signals and the discharge signals.

6. The semiconductor memory device of according claim 3, wherein the block select signal corresponds to at least one memory block in the memory cell array.

7. The semiconductor memory device according to claim 3, wherein the discharge signals are output from the control logic.

8. An operating method of a semiconductor memory device, comprising:
   generating a plurality of operating voltages in response to a command inputted from an outside;
   applying the plurality of operating voltages to a selected word line and unselected word lines of a memory cell array;
   performing a program operation;
   discharging a potential level of the selected word line to potential levels of the unselected word lines in a state in which the potential levels of the unselected word lines are maintained when an external power supply voltage is reduced during the program operation; and
   simultaneously discharging the potential level of the selected word line and the potential levels of the unselected word lines to a ground level after the potential level of the selected word line is discharged to the potential levels of the unselected word lines,
   wherein a discharge period of the selected word line and a discharge period of the unselected word lines differ from each other.

9. The operating method according to claim 8, wherein, during the program operation, a program voltage among the plurality of operating voltages is applied to the selected word line and a pass voltage among the plurality of operating voltages is applied to the unselected word lines.

* * * * *